(12) United States Patent
Hyun et al.

(10) Patent No.: US 9,021,158 B2
(45) Date of Patent: Apr. 28, 2015

(54) PROGRAM SUSPEND/RESUME FOR MEMORY

(71) Applicant: Fusion-io, Inc., Salt Lake City, UT (US)

(72) Inventors: Jea Woong Hyun, South Jordan, UT (US); Mark Brinicombe, San Jose, CA (US); Hairong Sun, Superior, CO (US); Hao Zhong, San Jose, CA (US); John Strasser, Syracuse, UT (US); Robert Wood, Niwot, CO (US)

(73) Assignee: SanDisk Technologies, Inc., Plano, TX (US)

( * ) Notice: Subject to any disclaimer, the term of this patent is extended or adjusted under 35 U.S.C. 154(b) by 0 days.

(21) Appl. No.: 13/834,955

(22) Filed: Mar. 15, 2013

(65) Prior Publication Data

US 2013/0205085 A1 Aug. 8, 2013

Related U.S. Application Data

(63) Continuation-in-part of application No. 13/372,430, filed on Feb. 13, 2012, now Pat. No. 8,972,627, which is a continuation-in-part of application No.

(Continued)

(51) Int. Cl.
*G06F 3/00* (2006.01)
*G06F 13/00* (2006.01)
*G06F 5/00* (2006.01)

(Continued)

(52) U.S. Cl.
CPC ............ *G06F 3/0688* (2013.01); *G06F 3/0611* (2013.01); *G06F 3/0659* (2013.01); *G06F 12/0246* (2013.01); *G11C 16/10* (2013.01);

(Continued)

(58) Field of Classification Search
CPC ..... G06F 3/0611; G06F 3/0659; G06F 3/0679; G11C 2216/20
See application file for complete search history.

(56) References Cited

U.S. PATENT DOCUMENTS 4,980,861 A 12/1990 Herdt et al.
5,742,787 A 4/1998 Talreja (Continued)

FOREIGN PATENT DOCUMENTS

GB 0123416.0 9/2001
WO 2010053756 5/2010

OTHER PUBLICATIONS

Shibata "19nm 112.8mm2 64Gb Multi-Level Flash Flash Memory with 400Mb/s/pin 1.8V Toggle Mode Interface" Flash Memory Summit, (2012), 30 pages.

(Continued)

*Primary Examiner* — Idriss N Alrobaye
*Assistant Examiner* — Ronald Modo
(74) *Attorney, Agent, or Firm* — Kunzler Law Group, PC

(57) ABSTRACT

A memory device includes a memory array with a plurality of memory elements. Each memory element is configured to store data. The device includes an input/output (I/O) buffer coupled to the memory array. The I/O buffer is configured to receive data from an I/O interface of a memory device controller and write the data to the memory array. The device includes a memory control manager coupled to the memory array. The memory control manager is configured to pause a program operation to the memory array in response to receiving a pause command. The memory control manager is also configured to resume the program operation in response to receiving a resume command.

24 Claims, 6 Drawing Sheets

Related U.S. Application Data

12/878,987, filed on Sep. 9, 2010, now Pat. No. 8,429,436.

(60) Provisional application No. 61/442,173, filed on Feb. 11, 2011, provisional application No. 61/245,622, filed on Sep. 24, 2009.

(51) Int. Cl.
| | |
|---|---|
| *G06F 13/28* | (2006.01) |
| *G06F 3/06* | (2006.01) |
| *G11C 16/10* | (2006.01) |
| *G06F 9/48* | (2006.01) |
| *G06F 12/02* | (2006.01) |

(52) U.S. Cl.
CPC ............ *G06F 3/0616* (2013.01); *G06F 3/0679* (2013.01); *G06F 9/485* (2013.01)

(56) References Cited

U.S. PATENT DOCUMENTS

| | | | |
|---|---|---|---|
| 5,799,200 A | 8/1998 | Brant et al. | |
| 5,805,501 A | 9/1998 | Shiau et al. | |
| 6,278,633 B1 | 8/2001 | Wong et al. | |
| 6,336,174 B1 | 1/2002 | Li et al. | |
| 6,404,647 B1 | 6/2002 | Minne | |
| 6,412,080 B1 | 6/2002 | Fleming et al. | |
| 6,515,909 B1 | 2/2003 | Wooldridge | |
| 6,515,928 B2 | 2/2003 | Sato et al. | |
| 6,552,955 B1 | 4/2003 | Miki | |
| 6,608,793 B2 | 8/2003 | Park et al. | |
| 6,633,950 B1 * | 10/2003 | Brown et al. | 711/103 |
| 6,633,956 B1 | 10/2003 | Mitani | |
| 6,643,181 B2 | 11/2003 | Sofer et al. | |
| 6,735,546 B2 | 5/2004 | Scheuerlein | |
| 6,751,155 B2 | 6/2004 | Gorobets | |
| 6,760,806 B2 | 7/2004 | Jeon | |
| 6,845,053 B2 | 1/2005 | Chevalier | |
| 6,849,480 B1 | 2/2005 | Low et al. | |
| 6,871,257 B2 | 3/2005 | Conley et al. | |
| 6,887,058 B2 | 5/2005 | Fujiwara | |
| 6,977,847 B2 | 12/2005 | Lasser et al. | |
| 7,042,664 B2 | 5/2006 | Gill et al. | |
| 7,057,936 B2 | 6/2006 | Yaegashi et al. | |
| 7,064,994 B1 | 6/2006 | Wu | |
| 7,167,944 B1 | 1/2007 | Estakhri | |
| 7,177,197 B2 | 2/2007 | Cernea | |
| 7,215,580 B2 | 5/2007 | Gorobets | |
| 7,227,777 B2 | 6/2007 | Roohparvar | |
| 7,257,129 B2 | 8/2007 | Lee et al. | |
| 7,263,591 B2 | 8/2007 | Estakhri et al. | |
| 7,340,558 B2 | 3/2008 | Lee et al. | |
| 7,340,581 B2 | 3/2008 | Gorobets et al. | |
| 7,400,537 B2 | 7/2008 | Hemink et al. | |
| 7,403,424 B2 | 7/2008 | Hemink et al. | |
| 7,424,593 B2 | 9/2008 | Estakhri et al. | |
| 7,441,090 B2 | 10/2008 | Estakhri et al. | |
| 7,451,344 B1 | 11/2008 | Rothberg | |
| 7,457,166 B2 | 11/2008 | Hemink et al. | |
| 7,460,432 B2 | 12/2008 | Warner | |
| 7,463,521 B2 | 12/2008 | Li | |
| 7,463,532 B2 | 12/2008 | Tran et al. | |
| 7,480,766 B2 | 1/2009 | Gorobets | |
| 7,495,954 B2 | 2/2009 | Ito | |
| 7,499,317 B2 | 3/2009 | Ito | |
| 7,499,338 B2 | 3/2009 | Ito | |
| 7,522,457 B2 | 4/2009 | Hemink et al. | |
| 7,529,905 B2 | 5/2009 | Sinclair | |
| 7,535,766 B2 | 5/2009 | Ito | |
| 7,630,255 B2 | 12/2009 | Yang | |
| 7,631,138 B2 | 12/2009 | Gonzalez et al. | |
| 7,777,652 B2 | 8/2010 | Lee et al. | |
| 7,856,528 B1 | 12/2010 | Frost et al. | |
| 7,908,501 B2 | 3/2011 | Kim et al. | |
| 7,930,589 B2 | 4/2011 | Lavastre et al. | |
| 7,944,762 B2 | 5/2011 | Gorobets | |
| 8,001,334 B2 | 8/2011 | Lee | |
| 8,055,922 B2 | 11/2011 | Brittain et al. | |
| 8,130,551 B2 | 3/2012 | Oowada et al. | |
| 8,364,888 B2 | 1/2013 | Melik-Martirosian et al. | |
| 8,429,436 B2 | 4/2013 | Fillingim et al. | |
| 2002/0066047 A1 | 5/2002 | Olarig | |
| 2002/0199056 A1 * | 12/2002 | Ayukawa et al. | 711/106 |
| 2003/0115405 A1 | 6/2003 | Funyu et al. | |
| 2003/0126475 A1 | 7/2003 | Bodas | |
| 2003/0210601 A1 | 11/2003 | Lin et al. | |
| 2004/0003167 A1 | 1/2004 | Kimura et al. | |
| 2004/0177054 A1 | 9/2004 | Stern et al. | |
| 2005/0210323 A1 | 9/2005 | Batchelor et al. | |
| 2005/0246558 A1 | 11/2005 | Ku | |
| 2006/0059326 A1 | 3/2006 | Aasheim et al. | |
| 2006/0106990 A1 | 5/2006 | Benhase et al. | |
| 2006/0149916 A1 | 7/2006 | Nase | |
| 2006/0184736 A1 | 8/2006 | Benhase et al. | |
| 2006/0230295 A1 | 10/2006 | Schumacher et al. | |
| 2006/0265624 A1 | 11/2006 | Moshayedi et al. | |
| 2007/0168698 A1 | 7/2007 | Coulson et al. | |
| 2007/0204270 A1 | 8/2007 | Shin | |
| 2007/0230253 A1 | 10/2007 | Kim | |
| 2007/0233938 A1 | 10/2007 | Cho et al. | |
| 2007/0234021 A1 | 10/2007 | Ruberg et al. | |
| 2007/0239926 A1 | 10/2007 | Gyl et al. | |
| 2007/0245094 A1 | 10/2007 | Lee et al. | |
| 2007/0274150 A1 | 11/2007 | Gorobets | |
| 2008/0052483 A1 | 2/2008 | Rangarajan et al. | |
| 2008/0059820 A1 | 3/2008 | Vaden | |
| 2008/0080243 A1 | 4/2008 | Edahiro et al. | |
| 2008/0104344 A1 | 5/2008 | Shimozono et al. | |
| 2008/0117686 A1 | 5/2008 | Yamada | |
| 2008/0126686 A1 | 5/2008 | Sokolov et al. | |
| 2008/0266973 A1 | 10/2008 | Sekar et al. | |
| 2008/0282031 A1 | 11/2008 | Tanoue | |
| 2008/0301475 A1 | 12/2008 | Felter | |
| 2009/0037778 A1 | 2/2009 | Resnick | |
| 2009/0091979 A1 | 4/2009 | Shaivi | |
| 2009/0091996 A1 | 4/2009 | Chen et al. | |
| 2009/0150621 A1 | 6/2009 | Lee | |
| 2009/0157989 A1 | 6/2009 | Karamcheti et al. | |
| 2009/0193183 A1 * | 7/2009 | Kudo et al. | 711/103 |
| 2009/0239468 A1 | 9/2009 | He et al. | |
| 2010/0049913 A1 | 2/2010 | Marcu et al. | |
| 2010/0102999 A1 | 4/2010 | Lee et al. | |
| 2010/0106917 A1 | 4/2010 | Ruberg et al. | |
| 2010/0153680 A1 | 6/2010 | Baum | |
| 2010/0257304 A1 | 10/2010 | Rajan et al. | |
| 2010/0262738 A1 | 10/2010 | Swing et al. | |
| 2010/0262740 A1 | 10/2010 | Borchers et al. | |
| 2010/0262757 A1 | 10/2010 | Sprinkle et al. | |
| 2010/0262758 A1 | 10/2010 | Swing et al. | |
| 2010/0262759 A1 | 10/2010 | Borchers et al. | |
| 2010/0262760 A1 | 10/2010 | Swing et al. | |
| 2010/0262761 A1 | 10/2010 | Borchers et al. | |
| 2010/0262762 A1 | 10/2010 | Borchers et al. | |
| 2010/0262766 A1 | 10/2010 | Sprinkle et al. | |
| 2010/0262767 A1 | 10/2010 | Borchers et al. | |
| 2010/0262773 A1 | 10/2010 | Borchers et al. | |
| 2010/0262894 A1 | 10/2010 | Swing et al. | |
| 2010/0262979 A1 | 10/2010 | Borchers et al. | |
| 2010/0268974 A1 | 10/2010 | Floyd et al. | |
| 2010/0332871 A1 | 12/2010 | Allalouf et al. | |
| 2011/0208911 A1 | 8/2011 | Taguchi et al. | |
| 2012/0254515 A1 | 10/2012 | Melik-Martirosian et al. | |
| 2014/0215175 A1 | 7/2014 | Kasorla et al. | |

OTHER PUBLICATIONS

Advanced Micro Devices, Inc., Am29DL322D/323D/324D Data Sheet, Publication No. 21534, Revision D, Amendment +7, Issue Date Oct. 7, 2004.

Agrawal et al., "ECC and Signal Processing Technology for Solid State Drives and Multi-bit per cell NAND FLash Memories" Forward Insights, Report No. FI-NFL-FSP-0110, (Jan. 2010), 174 pages.

2380.2.34PCT1, PCT/US2010/048321, International Search Report, Apr. 28, 2011.

(56) References Cited

OTHER PUBLICATIONS 2380.2.34PCT, PCT/US2010/048320, International Search Report, Apr. 29, 2011.
Leventhal, Adam, Flash Storage Memory, Communications of the ACM, vol. 51, No. 7, Jul. 2008
2380.2.34US1, Notice of Allowance, Application No. 12878981, Jun. 25, 2012.
The International Bureau of WIPO, International Preliminary Report on Patentability for PCT/US2012/024927, dated Aug. 13, 2013.
U.S. Appl. No. 13/800,628, 2380.2.147, Office Action, Dec. 5, 2014.
U.S. Appl. No. 13/372,430, 2380.2.62, Notice of Allowance, Nov. 3, 2014.

* cited by examiner

PROGRAM SUSPEND/RESUME FOR MEMORY

CROSS-REFERENCE TO RELATED APPLICATIONS

This application is a continuation-in-part of U.S. application Ser. No. 13/372,430 (U.S. Pat. Pub. No. 2012/0203986), entitled "Apparatus, System, and Method for Managing Operations for Data Storage Media," filed on Feb. 13, 2012, which claims the benefit of priority of U.S. Provisional Patent Application No. 61/442,173, entitled "Apparatus, System, and Method for Managing Throughput in a Storage Device," filed on Feb. 11, 2011, and is a continuation-in-part of U.S. application Ser. No. 12/878,987, entitled "Apparatus, System, and Method for Power Reduction in a Storage Device," filed on Sep. 9, 2010, which claims priority to U.S. Provisional Patent Application No. 61/245,622, entitled "Apparatus, System, and Method for Power Reduction in a Solid-State Storage Device," filed on Sep. 24, 2009, all of which are incorporated by reference herein.

BACKGROUND

Flash memory stores data in arrays of memory elements, or cells, formed from floating-gate transistors. NAND flash memory devices return previously stored data by reading a set of bits from individual cells in an array. The time required to write data to a cell is typically much longer than the time required to read data from a cell. As sizes for memory elements continue to decrease, write times continue to increase at a faster rate than read times.

Program operations typically occur in groups or pages of multiple memory cells. Read operations may occur in pages of memory cells or in smaller sets of memory cells. Many flash memory devices are designed to keep read times as low as possible to allow very fast access to the data stored at the memory cells. A memory device may include one or more chips, and a chip may include one or more memory arrays of memory cells. However, while a program operation is being performed for a given cell, other access to the chip on which the cell is located is blocked, including reading data stored at other cells on the same chip. As a result, an application requesting access to data stored at a given cell involved in a read request may not receive the data for a significantly long period of time if a program operation is being performed at the chip on which the given cell is located than if a read operation associated with the read request is performed immediately upon receipt of the read access request.

BRIEF DESCRIPTION OF THE DRAWINGS

Throughout the description, similar reference numbers may be used to identify similar elements.

DETAILED DESCRIPTION

Figure 1:
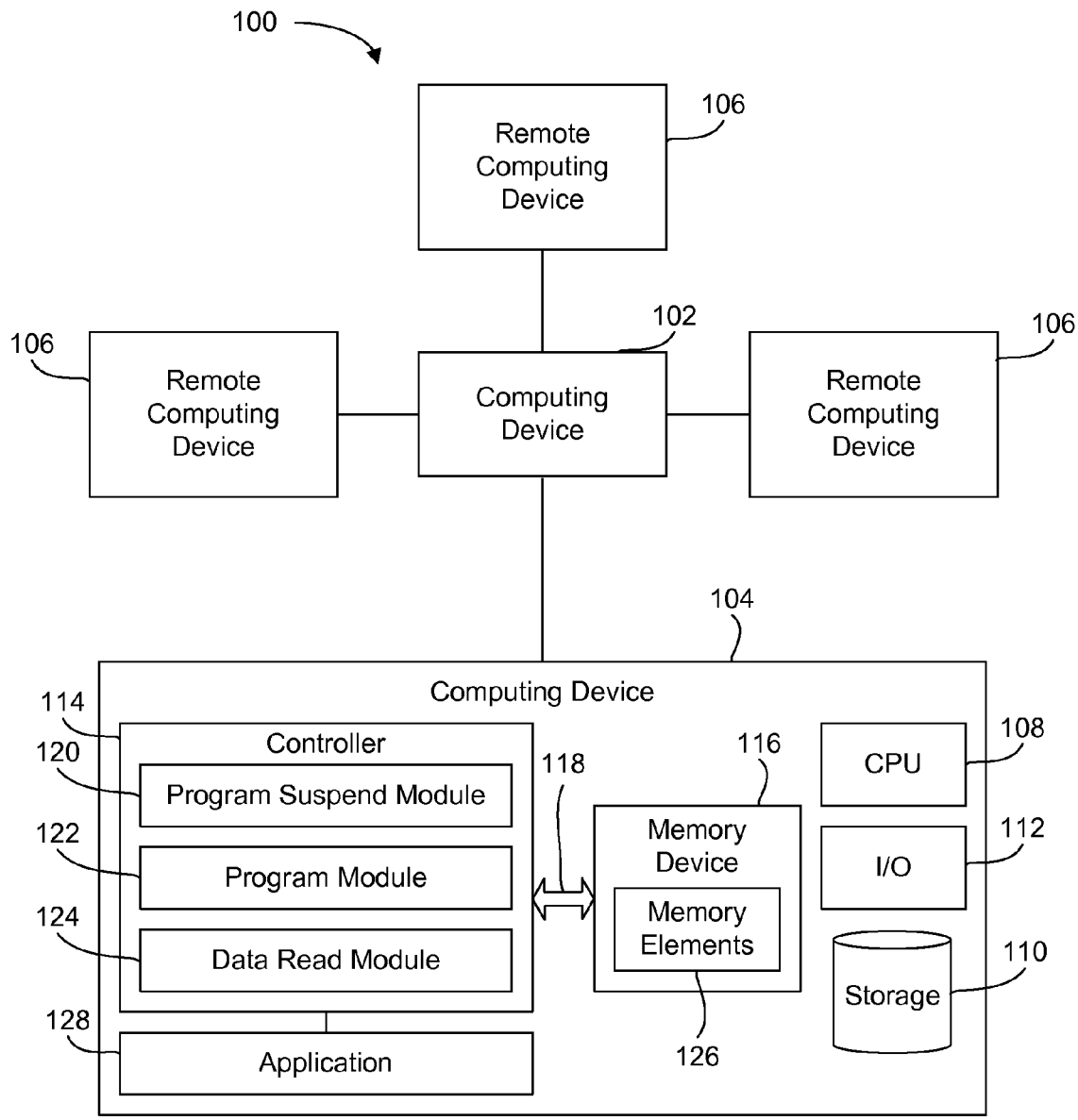
FIG. 1 depicts a schematic diagram of one embodiment of a network system which includes a computing device having a controller for a memory device.

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Reference to a computer readable medium may take any physical form capable of storing machine-readable instructions, at least for a time in a non-transient state, on a digital processing apparatus. A computer readable medium may be embodied by a compact disk, digital-video disk, a blu-ray disc, a magnetic tape, a Bernoulli drive, a magnetic disk, flash memory, integrated circuits, or other digital processing apparatus memory device.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment of the present invention. Thus, the phrases "in one embodiment," "in an embodiment," and similar language throughout this specification may, but do not necessarily, all refer to the same embodiment.

While many embodiments are described herein, at least some of the described embodiments facilitate program suspend/resume operations for an electronic storage device. In other words, a programming (or other equivalent) operation that is being processed at non-volatile memory (NVM) may be suspended, either temporarily or permanently, in order to allow one or more other memory access operations (e.g., read, erase, partial program, etc.) to be processed at the NVM. As used herein, the term "program operation" includes any operation to persist a value (digital or analog), or to persist a state which represents a value, on the NVM. Some examples of other program (or equivalent) operations include, but are not limited to, burning, storing, writing, and setting a persistent value on the NVM. References herein to a program operation are inclusive of other equivalent or similar operations. References herein to "suspending" are inclusive of other equivalent or similar terms, including, but not limited to, pausing, interrupting, queuing, and delaying.

The electronic storage device may be a NAND flash device that includes a memory array of memory elements. Each memory element is configured to store a charge, voltage, or other electrical parameter to represent the data. In other embodiments, the electronic storage device may include other types of NVM, such as other types of flash memory, read-only memory (ROM), magnetic storage devices, optical storage devices, and/or other types of NVM.

The program suspend operation may be performed to suspend a program (or write or other equivalent) operation to a given group (or page) of memory elements in order to read data from one of the memory elements on the same chip as the group of cells being programmed. While many embodiments described herein refer to memory access requests to a chip on which a program operation is executing, the principles described herein may alternatively refer to memory access requests to a page, block, die or plane. In some embodiments, in response to suspending a program operation, a voltage pulse count corresponding to the current program operation is stored before suspending the program operation, an operation corresponding to a memory access request, such as a read access request, queued behind the program operation is performed, and the program operation is then resumed at the stored pulse count. As described herein, reference to a read access request and a read operation may be substituted with other memory access requests and operations associated with the other memory access requests, respectively.

In some embodiments, the program operation is suspended only if the program operation satisfies a suspend threshold, which may be any condition that is used to determine whether to suspend a program operation. In some examples, the suspend threshold may be calculated based on or include one or more aspects of the program operation, the application accessing the memory device, capabilities of the memory device, programming page, and/or usage statistics of the memory device. In other examples, the suspend threshold may include other conditions. More specific examples are described in detail below.

As manufacturers create memory elements of smaller sizes for NAND flash devices, the latency, or time delay, associated with read, write, and erase times to memory elements increases. While read times continue to increase, write and erase times are increasing at a faster rate than read times. Additionally, when using different step sizes and starting voltages for programming memory elements, the write times may be increased even more.

One of the problems caused by this increase in write and erase times using conventional approaches is that program and erase operations may block read operations (or other relatively fast operations) from occurring on the same chip (or block/die/plane, as described above) that is currently processing a relatively long program or erase operation. Thus, access requests, such as read access requests, that are submitted to the NAND flash device while a program operation is being performed may take up to as long as the time needed to perform the full program operation in addition to the regular access request time for the operation associated with the access request.

In order to prevent one or more memory access requests from being stuck (queued) behind a program operation, the program operation may be suspended to allow the operation(s) associated with the memory access request(s) to be performed. The program operation may then be resumed to finish writing data to the selected group of memory elements. Resuming the program operation may require that the data being written to the NAND flash device be preserved/stored somewhere, such as a buffer. Resuming the program operation at the point where the program operation was suspended may require that the status information, such as a point where the program operation is suspended, also be stored somewhere. The current programming step may be stored in the same buffer as the data being written to the NAND flash device or at some other location on the NAND flash device or at a memory controller. Information related to how much data has been written for the program operation may need to be stored for the program operation to be resumed without starting the entire program operation over. Some embodiments also allow for additional criteria to be used in determining whether a program operation should be suspended to optimize read/write times and to maximize the life of the device.

FIG. 1 depicts a schematic diagram of one embodiment of a network system 100 that includes a computing device having a controller for a memory device. The depicted network system 100 includes various components, described in more detail below, that are capable of performing the functions and operations described herein. In one embodiment, at least some of the components of the network system 100 are implemented in a computer system. For example, the functionality of one or more components of the network system 100 may be implemented by computer program instructions stored and executed on another computing device 102. The network system 100 may include other components, such as a computing device 104 and one or more remote computing devices 106. The computing device 104 may include various components, including a processor 108 (such as a CPU), a storage device 110, input/output devices 112, a controller 114, and a memory device 116. The memory device 116 may include non-volatile memory and/or volatile memory. Some or all of the components of the network system 100 may be stored on a single computing device or on a network of computing devices, including a wireless communication network. The network system 100 may include more or fewer components or subsystems than those depicted herein. In some embodiments, the network system 100 may be used to implement the methods described herein.

In one embodiment, the controller 114 includes a physical input/output (I/O) interface 118 configured to couple the controller 114 to the memory device 116. In various embodiments, the controller 114 may be implemented by hardware, firmware, a driver, or other implementations capable of controlling operations in a memory device 116.

The memory device 116 includes one or more memory elements 126. In one embodiment, the memory device 116 is a NAND flash memory device. Other embodiments may incorporate other types of electronically erasable programmable memory devices. In some embodiments, the memory device 116 includes a single die with an array of memory elements 126, which is referred to herein as a memory array. In other embodiments, the memory device 116 corresponds to an integrated circuit (IC) package, or chip. Each chip may include one or more die, and each die includes an array of memory elements 126. In some embodiments, the memory device 116 includes a common circuit board used to mount a plurality of IC packages or chips, which arrangement is referred to herein as a chip array or a NAND array. For example, a chip array of 8, 16, 32, etc. chips may be mounted to a peripheral memory card that can be connected to a peripheral slot of a computing device. In some embodiments, the controller 114 is also mounted to the same circuit board as the chip array. Alternatively, the controller 114 may be located remotely (i.e., on a different circuit board) from one or more circuit boards with a chip array with which the controller 114 communicates.

The memory device 116 may be used for storing data associated with the computing device 104 and/or the network system 100. Although the computing device 104 is shown with a single memory device 116, other embodiments of the computing device 104 may include more than one memory device 116. Similarly, multiple memory devices 116 may be implemented at various locations within the network system 100. Embodiments of the network system 100 may provide dedicated or shared memory resources for one or more of the remote computing devices 106 and computing device 104, though other implementations of storage/memory resources or capacity may be used in conjunction with the network system 100.

The memory elements 126 may be single level cell (SLC) flash elements, multi-level cell (MLC) flash elements or tri level cell (TLC) flash elements. In general, solid-state memory elements 126 can be set to different programmable states that correspond to different bits or bit combinations. The memory elements 126 may be operated in a variety of modes in different embodiments. In a specific example, MLC flash elements may be operated in an SLC mode to store a single bit of data. In another example, the MLC flash elements may be operated in an MLC mode to store two or more bits of data per state. In other embodiments, the memory device 116 includes other types of memory elements 126 configured to operate in the modes described herein or in other modes.

In various embodiments, the memory device 116 may be a non-volatile memory device 116 in the form of a dual-inline memory module ("DIMM"), a daughter card, or a micro-module. In another embodiment, the memory device 116 is an element within a rack-mounted blade. In another embodiment, the memory device 116 is contained within a package that is integrated directly onto a higher level assembly (e.g., mother board, laptop, graphics processor, etc.). In another embodiment, individual components including the memory device 116 are integrated directly onto a higher level assembly without intermediate packaging.

The illustrated controller 114 includes a program suspend module 120, a program module 122, and a data read module 124. Other embodiments of the controller 114 may include fewer or more modular components. Additionally, the components described herein may perform the operations described herein in any manner, either separately or in conjunction with other components of the controller 114, memory device 116, and/or computing device 104.

In one embodiment, the program module 122 programs one or more bits of a memory element 126 of the memory device 116. In one embodiment, the program module 122 programs memory elements 126 by issuing an instruction to the memory device 116 to begin a program operation. The memory device 116 may then program the memory elements 126 by setting the memory elements 126 to a voltage level or state. Depending on the mode, configuration, and encoding of the memory elements 126, each state may represent one or more bits. The memory elements 126 may be programmed to different states depending on the desired bit configuration for each memory element 126. The data read module 124 reads at least one data bit from a memory element 126. In one embodiment, the data read module 124 reads the bit from the memory element 126 by detecting the current state for the memory element 126 and determining the bit(s) represented by the state. The program suspend module 120 suspends a program operation at a memory element 126 or group of memory elements 126. In one embodiment, the program suspend module 120 suspends the program operation by issuing an instruction to the memory device 116 to suspend the program operation. The memory device 116 may then suspend the program operation. The manner in which the program suspend process is implemented herein may affect some aspects of the program process implemented by the program module 122 and the read process implemented by the data read module 124. While the program suspend module 120 is described herein as being a part of the controller 114, in certain embodiments, the program suspend module 120 may be part of the memory device 116 or at another location in the system 100.

In one embodiment, the program module 122 determines, monitors, and/or sets a write time of the memory device 116. The write time refers to the time it takes to write data to the memory elements 126 by setting charge values for the memory elements 126 to specific levels. Program operations may be done for a group of memory elements 126 determined by the program module 122. The program module 122 may write data to a memory element 126 using an upper page write and a lower page write. In one example, an upper page write may take approximately 2 milliseconds. In another example, an upper page write may take approximately 2.3 milliseconds or longer. As the physical size of memory elements 126 continues to decrease, the upper page write may take even longer. Smaller memory elements 126 store fewer electrons. In order not to over-program the memory elements 126, smaller pulses are used. Because smaller pulses are used, more pulses may be required, which takes more time. Using different step sizes and starting voltages for programming the upper page write may also affect the write time.

The data read module 124 may determine or monitor a read time of the memory device 116. The read time refers to the time it takes for the memory device 116 to read the settings, or charge values, of the memory elements 126 in a word line and make corresponding digital signals available to the controller 114. In some embodiments, the overall read process includes the time it takes for the memory device 116 to perform various processing and development stages, including the time required to build up charge on the memory elements 126 to be read, develop charge at the sense amplifiers 146, and dissipate remaining charges within the memory array. In various embodiments, the read time for a read operation may be approximately 30-40 microseconds for lower page data and approximately 50-60 microseconds for upper page data.

The program suspend module 120 may implement a tuning mechanism to allow flexibility in tuning read and write performance. In some embodiments, the tuning mechanism includes using a probabilistic counter/interrupt program with a predetermined probability. In one embodiment, the predetermined probability is determined as a function of workload at the memory device 116 and performance requirements. The program suspend module 120 may estimate average read and write performance from the read time, write time, and the predetermined probability. In some embodiments, application usage of the memory device 116 influences how and/or when the program suspend module 120 suspends program operations to the memory device 116. The program suspend module 120 may suspend a program operation based on whether the application 128 or applications accessing the memory device 116 are read sensitive or write sensitive. In one embodiment, a read sensitive application is an application that has stricter performance requirements on read operations, and a write sensitive application is an application that has stricter performance requirements on program operations. In one example, if an application is read sensitive, the program suspend module 120 may be more likely to suspend a program operation when receiving a read access request from such an application than if the application is write sensitive. Conversely, if an application is write sensitive, the program suspend module 120 may be less likely to suspend a program operation when receiving a read access request than if the application is read sensitive.

In a program operation, in some embodiments, a lower page of the memory element 126 is programmed and then an upper page of the memory element 126 is programmed. In one embodiments, the program suspend module 120 is configured to suspend only lower page programming. In another embodiment, the program suspend module 120 is configured to suspend only upper page programming. In one embodiment, lower page data corresponds to a least significant bit (LSB) of the data stored in the memory element 126 and upper page data corresponds to a most significant bit (MSB) of the data stored in the memory element. Suspending upper page programming may increase the time needed to complete the upper page program operations, but allow a read operation corresponding to a read access request queued behind the program operation to occur faster and not be delayed by the write time. Alternatively, suspending lower page programming may make the write time evenly distributed across upper and lower pages, rather than making upper or lower page write operations take longer.

In some embodiments, the performance parameters or device characteristics of the memory device 116 influence how and/or when the program suspend module 120 suspends program operations to the memory device 116. In one embodiment, the device characteristics include usage statistics of the memory elements 126. In various embodiments, the usage statistics may include program/erase (P/E) cycle counts per erase block (EB), bit error rate (BER, as well as the RBER and/or UBER), typical device temperature, and/or other usage statistics such as the dwell time of the memory elements 126. For example, as the P/E cycle counts for the EBs increase, program operations at the memory device 116 may take a shorter amount of time. In one embodiment, the probability that program operations are suspended decreases as the P/E cycle counts increase because memory access requests queued behind program operations may have shorter wait times if the program operations are allowed to complete before performing the operations associated with memory access requests. In another embodiment, the device characteristics include the geometric size of the memory element 126 (e.g. 24 nanometers (nm), 21 nm, 32 nm, etc.), the manufacturer, the number of failed cells or other physical or inherent characteristics of the memory element 126.

In some embodiments, the program suspend module 120 is configured to store information that defines the state or progress of the program operation, including a pulse count at which the current program operation is suspended. In one embodiment, the data being written to memory elements 126 is stored in a buffer. In one embodiment, additional information that describes the program operation—including, but not limited to, pulse count, pulse duration, pulse magnitude, and step magnitude (or delta)—is stored in a buffer on the memory device 116, in another component on the memory device 116, at the controller 114, or another component on the computing device 104. The information defining the state or progress of the program operation may be tracked while the program operation is running, for example at the controller 114 or at a component on the memory device 116, so that when a program operation is suspended, the information may be retained for resuming the program operation. The information may be stored in a non-volatile storage so that the information is retained in the event of a power loss. In one embodiment, as described in more detail below with reference to FIGS. 3A-3B, the program operations are performed using incremental step pulse programming (ISPP), in which a memory element 126 is programmed to a specific state (bit combination) using incremental voltage steps or pulses. Suspending the program operation may include suspending the program operation at a specific incremental voltage step. The current voltage level and/or number of voltage steps that have been applied to the memory element 126 may be stored. When the program operation is resumed, the memory device 116 may use the stored voltage level and/or number of voltage steps to determine where to resume the program operation to the memory element 126. The program operation may be resumed at the stored voltage step, at a step lower or near the stored voltage step, at the beginning of the program operation, or at any voltage step as determined by the program suspend module 120. In another embodiment, another module or component may determine when and where to resume the program operation. Although the program operation is described above using ISPP, the program operation may be performed using any programming method to a memory element and the program operation may be resumed in accordance with the programming method.

The data being written to the memory device 116 is also stored so that the program module 122 may resume the program operation when a read operation corresponding to a read access request queued behind the program operation is finished. When a program operation is currently executing, application access to the chip being programmed may be blocked until after the program operation is resumed and completed. Suspending the program operation may allow the application to access the chip to perform other operations at the chip while the program operation is suspended. Alternatively, application access to the chip being programmed may not be blocked.

The program suspend module 120 may suspend a program operation at one or more groups of memory elements 126 of the memory device 116 in response to receiving a read access request or other memory access request from an application 128. Alternatively, another module or component in communication with the program suspend module 120 may receive the memory access request from the application 128 and indicate to the program suspend module 120 that an access request has been received and that a program operation should be suspended. To suspend the program operation, the program suspend module 120 may issue a suspend command to the memory device 116, which then suspends the program operation. In one embodiment, the controller 114 receives a read access request from an application 128. The read access request may be a read request that includes information about the data to be read from the memory device 116. In some embodiments, the controller 114 generates additional information for a read request to be sent to the memory device 116. The read request may then be sent to the memory device 116 to perform the read operation after the program suspend module 120 has suspended the program operation or after the program operation is completed.

In another embodiment, the controller 114 receives a program operation with a higher processing priority than a current program operation being executed at the memory device 116. The priority of the program operation may be determined at an operating system level, at the controller 114 or at the memory device 116. Priority may be established at the controller 114 or memory device 116 according to a user-specified priority list, application read/write sensitivity, storage capabilities of the memory device 116, and/or other criteria. The current program operation may be suspended to allow the memory device 116 to perform the higher priority program operation. In other embodiments, the controller 114 receives other types of access requests that have a higher priority than the current program operation.

In some embodiments, the program suspend module 120 sends a suspend command to the memory device 116 automatically upon receiving a read access request. In some embodiments, the program suspend module 120 sends a suspend command to the memory device 116 at some period of time after receiving the read access request. For example, the program suspend module 120 may first make a determination that the program operation should be suspended before sending the suspend command. The program suspend module 120 may determine that the program operation should not be suspended, and the read operation corresponding to the read access request is not completed until after the program operation is completed. For example, the program suspend module 120 may determine that the program operation should not be suspended if a certain percentage (or number of voltage steps) of the program operation being executed has been reached. The percentage or number of voltage steps at which the program operation is suspended may be determined based on age of the device, the number of access requests behind the program operation, the priority of the access requests, and/or other factors related to the memory device 116, controller 114 or application 128. These factors may be included in calculating a suspend threshold, which may include any criteria used to determine when to suspend a program operation currently executing within the memory device 116. In some embodiments, some of the operations for determining whether the program operation should be suspended are done at the memory device 116.

Figure 2:
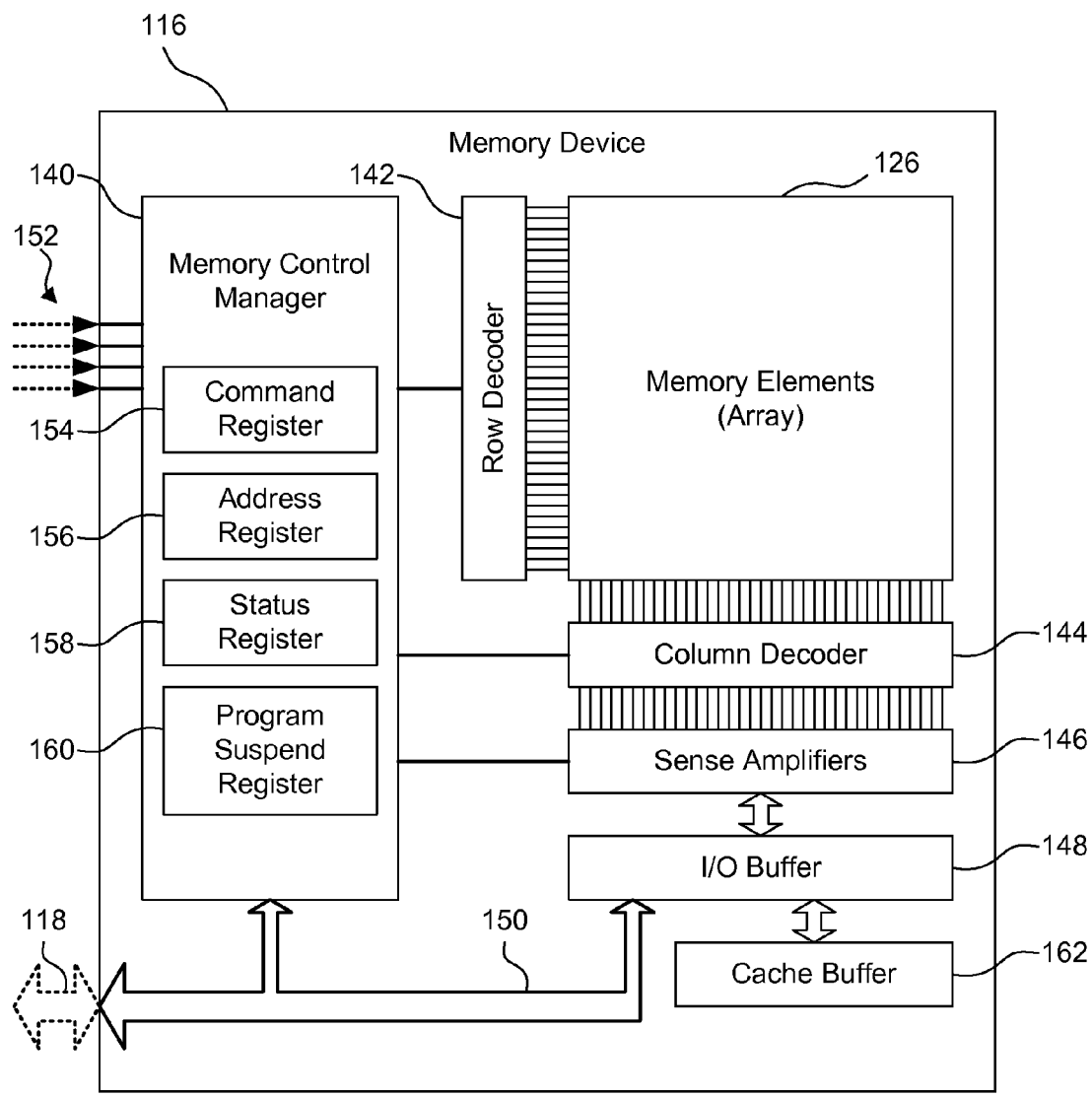
FIG. 2 depicts a schematic diagram of one embodiment of the memory device of FIG. 1.

FIG. 2 depicts a schematic diagram of one embodiment of the memory device 116 of FIG. 1. The illustrated memory device 116 includes the memory elements 126, a memory control manager 140, a row decoder 142, a column decoder 144, a plurality of sense amplifiers 146, an input/output (I/O) buffer 148, and an I/O bus 150. Although the memory device 116 is shown in FIG. 2 with certain components and described herein with certain functionality, other embodiments of the memory device 116 may include fewer or more components to implement similar or different functionality.

In general, the memory control manager 140 controls read, write, and, in certain embodiments, erase operations on the memory elements 126. The read, write, and erase operations are collectively referred to as memory access operations. The memory control manager 140 controls the application of different voltage levels at the row decoder 142 and/or the column decoder 144 to perform the memory access operations at some or all of the memory elements 126. Although the memory device 116 is shown with only a single array of memory elements 126, other embodiments may include multiple arrays of memory elements 126, in which case each array may have its own row decoder 142 and column decoder 144, but may share the same memory control manager 140.

In one embodiment, control signals from the controller 114 are transmitted to the memory device 116 via one or more control signal lines 152. Some examples of possible control signals include, but are not limited to chip select, read, write, address, command, erase, suspend and resume signals (commands). Similarly, data is transferred between the controller 114 and the memory device 116 via a data bus 150 (e.g., 8-bit). Within the memory device 116, the data bus 150 may be coupled to the memory control manager 140 and the I/O buffer 148. Other embodiments may use a different number or configuration of communication channels for control, address, and data signals between the controller 114 and the memory device 116.

In order to perform a read/write operation, the controller 114 may send one or more signals to the memory control manager 140. The write signal may include a write command and one or more addresses for a grouping of memory elements 126 to be programmed, and read requests may include a read command and an address (or set of addresses) for a grouping of memory elements 126 to be read. In one embodiment, the memory control manager 140 stores the read/write command in a command register 154. Similarly, the memory control manager 140 stores the address(es) in an address register 156. Upon initiating the corresponding program operation, the memory control manager 140 may store a status bit value in a status register 158 to indicate that the memory control manager 140 is busy processing the read/write command. As an example, the memory control manager 140 may store a bit value of zero (0) in the status register 158 to indicate that the memory control manager 140 is busy processing the read/write command, although other embodiments may use other bit quantity/value conventions. Storing a bit value in the status register 158 may allow the controller 114 to check the status bit in order to determine if the memory device 116 is busy processing a read/write command.

In one embodiment, when writing data to the memory elements 126, digital signals are transferred via an I/O bus 150 to a main I/O buffer 148 and then to the sense amplifiers 146. The sense amplifiers 146 convert the digital values to corresponding analog signals and modify the signals as needed. The memory control manager 140 uses the addresses provided in the write command to write to column values for a given row (or rows) within the array. In particular, the memory control manager 140 controls the row decoder 142 to activate a particular row and, simultaneously, controls the column decoder 144 to transfer values from the sense amplifiers 146 to the selected row(s) and column(s).

In order to retrieve the stored data from the memory elements 126, the memory control manager 140 uses the address (es) to read out column values for a given row (or rows) within the array. In particular, the memory control manager 140 controls the row decoder 142 to activate a particular row and, simultaneously, controls the column decoder 144 to transfer column values from the selected row of memory elements 126 to corresponding sense amplifiers 146. In the present embodiment, the sense amplifiers 146 convert the stored analog signals to corresponding digital values, amplify the signals as needed, and transfer the digital signals to the I/O buffer 148.

When data is available at the I/O buffer 148 either for writing to the memory elements 126 or due to reading from the memory elements 126, the memory control manager 140 may set a status bit within the status register 158 to indicate that data is ready to be written or read. The memory control manager 140 may control the operations of the decoders and sense amplifiers 146 for writing data to the memory elements 126 or reading data from the memory elements 126. The memory control manager 140 may also indicate to the controller 114 that data is at the I/O buffer 148 to be read. For example, the memory control manager 140 may store a bit value of one (1) in the status register 158 to indicate that the data is ready to be read.

When the memory device 116 is performing a write command at a given set of memory elements 126, the memory device 116 is not able to perform a read command at any of the memory elements 126 on the same chip/die/plane or chips. Thus, any read operations to be performed on the chip/die/plane where a program operation is occurring are blocked from being performed as long as the program operation is occurring.

In some embodiments, the memory control manager 140 includes a program suspend register 160 to indicate whether a program operation is to be suspended. In one embodiment, if the memory control manager 140 receives a read request from the controller 114 to read data from a chip while a program operation is being performed on the chip, the memory control manager 140 may determine to suspend the program operation in order to perform the read operation. The determination to suspend a program operation may be made at the memory control manager 140, as described in the present embodiment, or at the controller 114 or other component. The memory control manager 140 may then set a bit of the program suspend register 160 to indicate that the memory control manager 140 is suspending the current program operation. As an example, the memory control manager 140 may store a bit value of one (1) in the program suspend register 160 to indicate that the current program operation is suspended.

In one embodiment, the memory control manager 140 suspends the program operation in response to receiving a suspend command from the controller 114 after the controller 114 makes a determination to suspend the program operation. Other embodiments may include other conventions of suspending the program operation and indicating to the controller 114 that the program operation is suspended while a read operation is performed.

In the embodiment of FIG. 2, the I/O buffer 148 is used for performing both program operations and read operations for the memory elements 126. In one embodiment, when the memory control manager 140 suspends the program operation, the data being written to the memory elements 126 stored in the I/O buffer 148 is transferred to a cache buffer 162 for temporary storage while the program operation is suspended. The memory control manager 140 may then perform the read operation at the memory elements 126 and retrieve the data stored at the specified address(es).

Once initial data from the memory elements 126 is available at the I/O buffer 148, the memory control manager 140 may set the status bit within the status register 158 to indicate that the controller 114 can read the data retrieved from the memory elements 126. For example, the memory control manager 140 may store a bit value of one (1) in the status register 158 to indicate that the memory control manager 140 is done processing the initial data of the read command. The data values from the I/O buffer 148 then may be transferred to the controller 114, or location designated by the controller 114, via the data bus 150 and the physical I/O interface 118.

After the read operation is completed and the data read from the memory elements 126 is transferred from the I/O buffer 148, the program operation may be resumed. In one embodiment, after the controller 114 receives the data for the read operation, the controller 114 sends a resume command to the memory control manager 140. In one embodiment, when the program operation is resumed, the data stored in the cache buffer 162 is transferred back to the I/O buffer 148. The data in the I/O buffer 148 may then be written to the memory elements 126 at the specified addresses. In some embodiments, information corresponding to the state of the program operation when the program operation is suspended may be stored, such as the current step voltage value stored for the program operation or number of programming iterations for the program operation. This information may be stored in the cache buffer 162, the memory control manager 140, or some other location on the memory device 116.

Figure 3A:
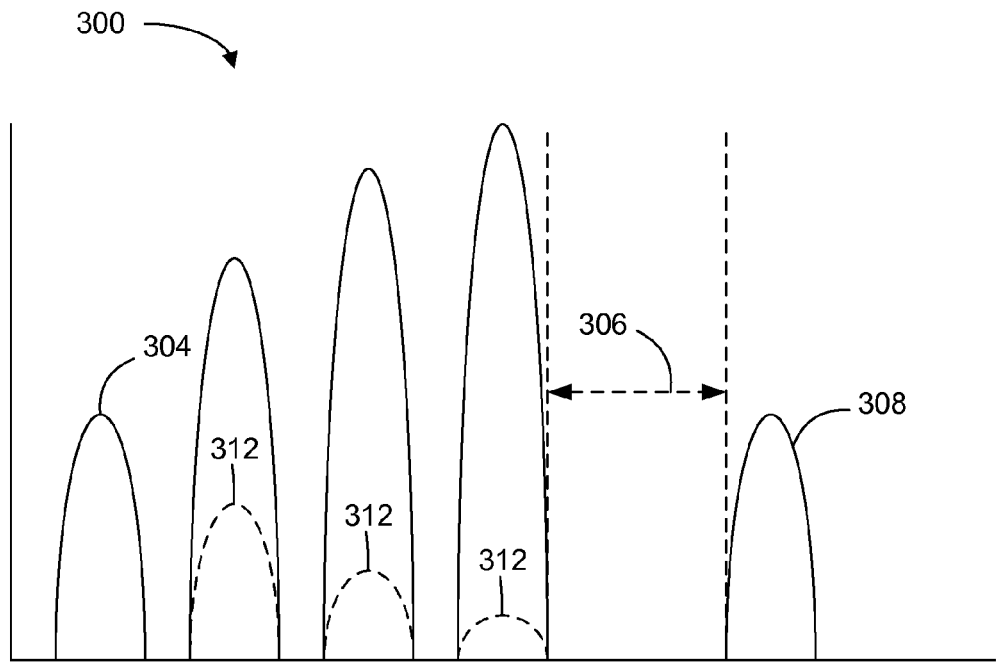
FIGS. 3A-3B depict graph diagrams of embodiments of voltage pulses in a program operation.
Figure 3B:
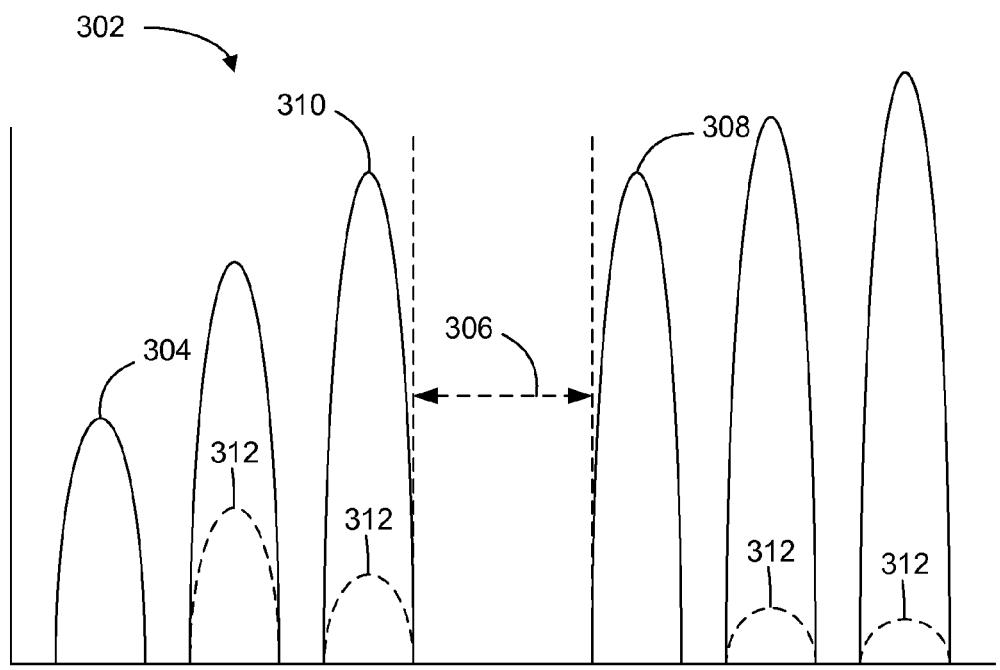

FIGS. 3A-3B depict graph diagrams 300, 302 of embodiments of voltage pulses in a program operation. As described herein, the voltage pulses for a program operation may be performed using an ISPP approach. While the program operation is described herein in conjunction with the ISPP approach shown in FIGS. 3A-3B, the program operation may be implemented using any programming approach. In the embodiments of FIGS. 3A and 3B, the x-axes represent time and the y-axes represent the voltage amplitude/magnitude of pulses applied to the memory element 126.

FIG. 3A depicts a graph diagram 300 of an embodiment of voltage pulses for a program operation at a memory element 126 that is suspended to perform an operation corresponding to a memory access request queued behind the program operation. The program operation may be performed using incremental pulses which incrementally increase the voltage level of each pulse, which in turn increases the voltage level stored at the memory element 126. In one embodiment, the first pulse 304 applied to the memory element 126 has the lowest pulse amplitude of the pulses, and the amplitude for each subsequent pulse in the program operation increases as the voltage level stored in the memory element 126 gets closer to the voltage level for the desired state. The pulse delta 312 (or change in voltage level for each pulse) from one pulse to the next decreases as the voltage level stored at the memory element 126 gets closer to the voltage level for the desired state. In one embodiment, the first voltage pulse 304 has the highest delta 312. When the memory access request is received by the memory device 116, the program operation may be suspended and the operation 306 corresponding to the memory access request is performed.

In one embodiment, as shown in FIG. 3A, the program operation is resumed from the beginning of the program operation, such that the first pulse 308 applied to the memory element 126 after resuming the program operation has the same or approximately the same amplitude as the initial pulse 304. In various examples, the program operation may be resumed from the beginning of the program operation if the program operation had been suspended for a certain amount of time or if the program operation had progressed to a certain percentage of completion or to a certain voltage level. For program operations that are resumed from the beginning of the program operation, information that describes a progress of the program operation may not need to be stored, or if it has been stored, it may be discarded.

In another embodiment, as shown in the graph diagram 302 of FIG. 3B, the program operation is resumed where the program operation was suspended to perform the operation 306 corresponding to the memory access request queued behind the program operation. In such an embodiment, the program state information that describes the progress of the program operation may be stored. The information may be stored at the memory device 116, at the controller 114, or at any location accessible to the memory device 116. The program state information may include a pulse count, a pulse amplitude, a pulse width or duration, the pulse delta and other information that describes the pulse(s) and progress of the program operation. The information may also include information about the current voltage level stored at the memory element 126.

When the program operation is resumed, the program state information may be retrieved and the program operation may be resumed using the stored program state information. In one example, the program operation is resumed by continuing the ISPP process from the last complete pulse 310 and applying subsequent pulses to the memory element 126, such that the first pulse 308 after resuming the program operation has a greater amplitude, but smaller delta 312, than the last completed pulse 310. If the program operation has been suspended for a certain amount of time, the program operation may be resumed at a point in the ISPP process sometime before the point at which the program operation was suspended. For example, the program operation may be resumed by applying a pulse equal to the last completed pulse or a pulse of smaller magnitude than the last completed pulse 310. In other examples, the program operation may be resumed by resuming the ISPP process at any point in the program operation using the stored information.

In the embodiments of FIGS. 3A and 3B, the data being written to the memory element 126 for the program operation is stored so that the program operation may be resumed, either at the beginning of the program operation, or at some other point in the program operation.

Figure 4A:
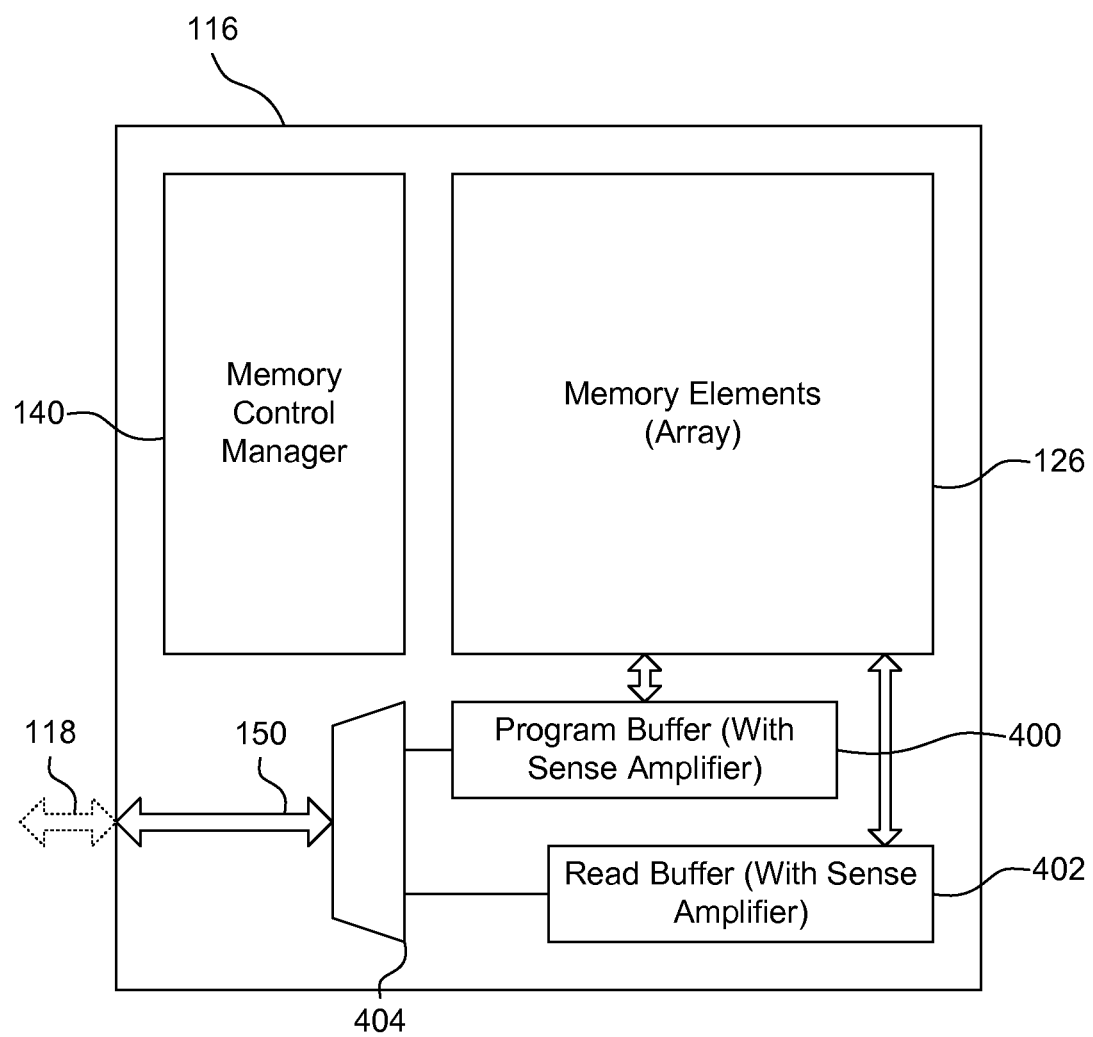
FIGS. 4A-4B depict schematic diagrams of embodiments of the memory device of FIG. 1.
Figure 4B:
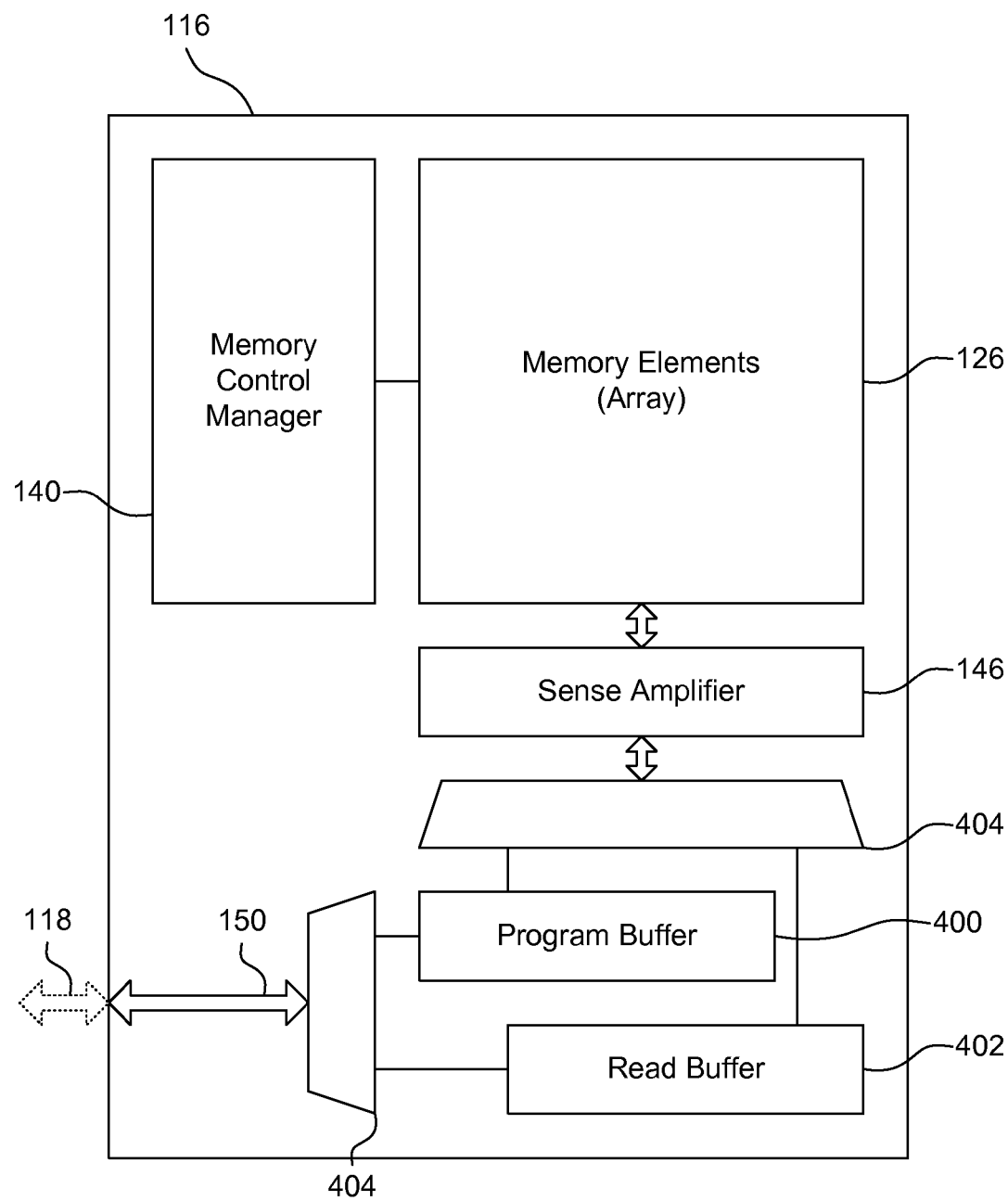

FIGS. 4A and 4B depict schematic diagrams of alternative embodiments of the memory device 116 of FIG. 1. While the memory devices 116 of FIGS. 4A and 4B are described herein in conjunction with the computing device 104 and controller 114 of FIG. 1, the memory devices 116 may be used in conjunction with any type of computing device and controller 114.

The memory device 116 may include separate buffers for performing program operations and read operations. The I/O bus 150 may be connected to the separate program buffer 400 and read buffer 402 via a multiplexer 404. For program operations, the multiplexer 404 allows digital data from the I/O bus 150 to be input into the program buffer 400.

In one embodiment, as shown in FIG. 4A, the program buffer 400 and the read buffer 402 are each connected to separate sense amplifiers 146. Because the memory device 116 has a separate program buffer 400 and read buffer 402, the data stored in the program buffer 400 for a program operation does not need to be stored in a separate cache buffer 162. Rather, the data for the program operation may be stored in the program buffer 400 during the read operation because the data for each read operation is transferred to the I/O bus 150 via the read buffer 402.

In another embodiment, as shown in FIG. 4B, the program buffer 400 and the read buffer 402 are each connected to the same sense amplifier 146 (or sense amplifiers). The sense amplifier 146 may select the buffer for a read/write operation via a multiplexer 404. Because sense amplifiers 146 are very large and can take up a lot of space on a memory device 116, connecting the program buffer 400 and the read buffer 402 to the same sense amplifier 146 may significantly reduce the overall size of the memory device 116.

Figure 5:
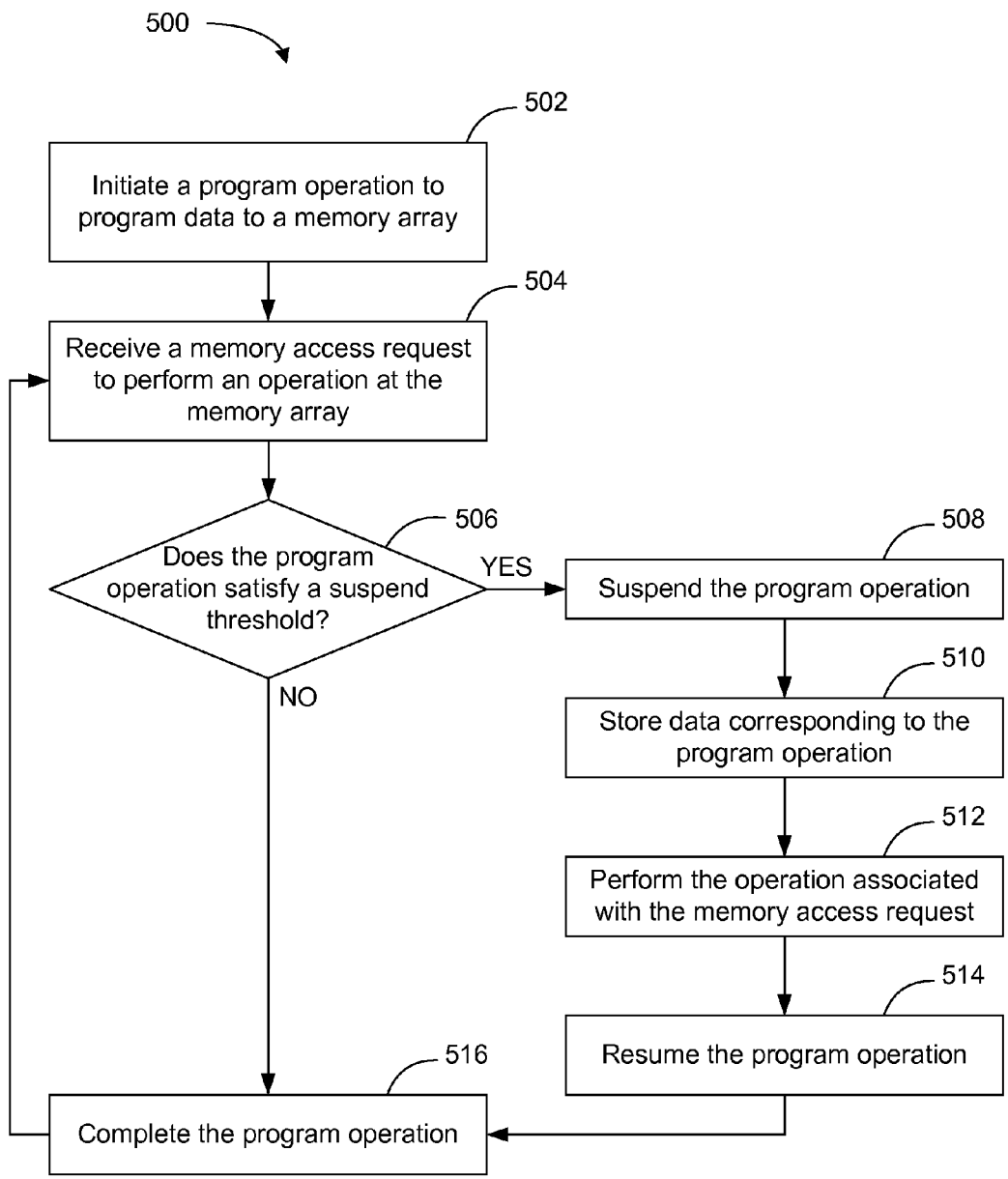
FIG. 5 depicts a flow chart diagram of one embodiment of a method for suspending a program operation to the memory device of FIG. 2.

FIG. 5 depicts a flow chart diagram of one embodiment of a method 500 for suspending a program operation to the memory device 116 of FIG. 2. Although the method 500 is shown and described with operations of the controller 114 and memory device 116 of FIG. 1, other embodiments of the method 500 may be implemented with other controllers and/or memory devices.

In one embodiment, the method 500 includes initiating 502 a program operation to program data to the memory array from the I/O interface 118 of the controller 114. The program operation includes programming data stored in an I/O buffer 148 or a program buffer 400 on the memory device 116 to a group of memory elements 126 in the memory array at addresses specified in the write signal. The group of memory elements 126 to be programmed may be located on more than one memory array.

When the memory device 116 receives 504 a memory access request from the I/O interface 118 to perform an operation associated with the memory access request at the memory array, the method 500 may include determining whether the address corresponding to the memory access request is located on the same chip as the program operation. If the address corresponding to the memory access request is located on the same chip as the current program operation, the method 500 includes determining 506 whether the program operation satisfies a suspend threshold. The suspend threshold may be used to determine whether to suspend the current program operation in response to receiving the read request or to wait until the program operation is completed before performing the read operation for the read request. If the program operation does not satisfy the suspend threshold, the program operation is completed 516 before performing the read operation.

The suspend threshold may be used to balance read performance and program performance and may be based on various criteria. In one example, the suspend threshold may be based on how close the program operation is to being completed or pulse count of the program operation. The program operation may be performed in multiple iterations of different voltage values. When the program operation reaches a specified number or percentage of total voltage pulses, the program operation may be allowed to complete rather than suspending the program operation to perform the read operation. In another example, the suspend threshold may be based on a read/write sensitivity of an application 128 requesting access to the memory device 116 for read/write operations. If the application 128 has stricter performance requirements for program operations, the threshold may be weighted to give more priority to program operations. If the application 128 has stricter performance requirements for read operations, the threshold may be weighted to give more priority to read operations. Other embodiments may give different weights to program and read operations based on the read/write sensitivity. The threshold may also include the programming page type (upper/lower). The suspend threshold may be based on probabilities or other criteria not described herein.

Once a determination has been made that the program operation satisfies the suspend threshold, the program operation is suspended 508 and any writes to the memory elements 126 are stopped. While the method is described herein to include suspending the program operation, the program operation may be paused, interrupted, queued, delayed, stopped or equivalents. In some embodiments, only a specified page of program operations is suspended—for example, program operations may be suspended only at an upper page or at lower page, depending on the implementation. The data corresponding to the program operation is stored 510 at a buffer in the memory device 116. The data corresponding to the program operation includes the data being programmed to the memory elements 126. In one embodiment, the programming state information describing a progress of the program operation is also stored. In one embodiment, the buffer used to store data for writing to the memory elements 126 is also used to store data read from the memory elements 126. In such an embodiment, the data is transferred to a cache buffer 162 coupled to the I/O buffer 148 so that the main I/O buffer 148 is able to receive the data corresponding to the read request. The method 500 may also store the pulse count that describes a current (or present) programming voltage level corresponding to the program operation and may store other information that describes the program operation, such as information about the pulses applied to the memory elements 126.

In other embodiments, the memory device 116 includes a program buffer 400 to store data to be written to the memory elements 126 and a read buffer 402 to store data read from the memory elements 126. In such embodiments, the data corresponding to the program operation may be stored in the program buffer 400 and does not need to be transferred to another buffer. The program buffer 400 and the read buffer 402 may be connected to the same sense amplifier 146 or separate sense amplifiers 146 for transferring data between the buffers and the memory elements 126.

After storing the data, the method 500 includes performing 512 the operation associated with the memory access request queued behind the program operation. The memory access request includes an address corresponding to a block/page/erase block/sector for one or more memory elements 126 in the memory array. Where the memory access request is a read operation, the data from the memory element 126 or memory elements 126 is read and copied to the I/O buffer 148 or read buffer 402. The data fetched from the memory array may then be sent on the I/O bus 150 to the controller 114. In one embodiment, a status register 158 at the memory device 116 is set to indicate that the read operation is completed.

The program operation is then resumed 514 in response to receiving a resume command or signal from the controller 114. The resume signal indicates that the operation associated with the memory access request is completed. The data for programming to the memory elements 126 for the program operation that was transferred to a cache buffer 162 or other buffer in order to perform the operation corresponding to the memory access request is transferred back to the I/O buffer 148 that performs the program operation. The program operation may be suspended more than once for subsequent memory access requests queued behind the program operation. Alternatively, the program operation may be suspended to allow several operations to be performed for different memory access requests before resuming the program operation. The program operation may then be completed 516. In one embodiment, the program operation is resumed at the beginning of the program operation. In another embodiment, the program operation is resumed at the stored pulse count rather than starting the program operation at the starting voltage.

While many embodiments are described herein, some embodiments relate to an apparatus. The apparatus includes an input/output (I/O) interface configured to couple the controller to an I/O buffer of a memory device. The apparatus includes a program module coupled to the I/O interface. The program module is configured to issue an instruction to the memory device to program data to the memory device via the I/O buffer. The apparatus includes a program suspend module coupled to the I/O interface. The program suspend module is configured to issue a suspend command to the memory device to suspend a program operation executing within the memory device in response to receiving a memory access request from an application to perform an operation at the memory device. The program suspend module is also configured to issue a resume command to the memory device to resume the program operation in response to completing the operation associated with the memory access request.

Other embodiments described herein relate to a memory device. The electronic memory device includes a memory array with a plurality of memory elements. Each memory element is configured to store data. The device includes an I/O buffer coupled to the memory array. The I/O buffer is configured to receive data from an input/output (I/O) interface of a memory device controller and write the data to the memory array. The device includes a memory control manager coupled to the memory array. The memory control manager is configured to pause a program operation to the memory array in response to receiving a pause command.

Other embodiments described herein relate to a method for suspending a program operation in a memory device. The method includes performing a portion of the program operation including receiving data from an input/output (I/O) interface of a memory device controller and writing the data to a memory array. The method also includes receiving a memory access request to the memory device. The method also includes suspending the program operation in response to receiving the memory access request. The method also includes performing an operation for the memory access request.

Other embodiments described herein relate to a system. The system includes means for writing data to a memory device. The memory device includes a memory array with a plurality of memory elements. Each memory element is configured to store data. The system includes means for suspending a program operation to the memory array in response to receiving a memory access request to the memory device. The system includes means for resuming the program operation in response to completing an operation associated with the memory access request.

An embodiment of the electronic memory device controller includes at least one processor coupled directly or indirectly to memory elements through a system bus such as a data, address, and/or control bus. The memory elements can include local memory employed during actual execution of the program code, bulk storage, and cache memories which provide temporary storage of at least some program code in order to reduce the number of times code must be retrieved from bulk storage during execution.

It should also be noted that at least some of the operations for the methods may be implemented using software instructions stored on a computer useable storage medium for execution by a computer. As an example, an embodiment of a computer program product includes a computer useable storage medium to store a computer readable program that, when executed on a computer, causes the computer to perform operations, as described herein.

Embodiments of the invention can take the form of an entirely hardware embodiment, an entirely software embodiment, or an embodiment containing both hardware and software elements. In one embodiment, the invention is implemented in software, which includes but is not limited to firmware, resident software, microcode, etc.

Furthermore, embodiments of the invention can take the form of a computer program product accessible from a computer-usable or computer-readable medium providing program code for use by or in connection with a computer or any instruction execution system. For the purposes of this description, a computer-usable or computer readable medium can be any apparatus that can contain, store, communicate, propagate, or transport the program for use by or in connection with the instruction execution system, apparatus, or device.

The computer-useable or computer-readable medium can be an electronic, magnetic, optical, electromagnetic, infrared, or semiconductor system (or apparatus or device), or a propagation medium. Examples of a computer-readable medium include a semiconductor or solid state memory, magnetic tape, a removable computer diskette, a random access memory (RAM), a read-only memory (ROM), a rigid magnetic disk, and an optical disk. Current examples of optical disks include a compact disk with read only memory (CD-ROM), a compact disk with read/write (CD-R/W), and a digital video disk (DVD).

Input/output or I/O devices (including but not limited to keyboards, displays, pointing devices, etc.) can be coupled to the system either directly or through intervening I/O controllers. Additionally, network adapters also may be coupled to the system to enable the data processing system to become coupled to other data processing systems or remote printers or memory devices through intervening private or public networks. Modems, cable modems, and Ethernet cards are just a few of the currently available types of network adapters.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

In the above description, specific details of various embodiments are provided. However, some embodiments may be practiced with less than all of these specific details. In other instances, certain methods, procedures, components, structures, and/or functions are described in no more detail than to enable the various embodiments of the invention, for the sake of brevity and clarity.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. An apparatus comprising:
   an input/output (I/O) interface configured to couple the apparatus to an I/O buffer coupled to memory elements of a memory device, the I/O buffer residing on the same die as the memory elements;
   a program module coupled to the I/O interface, wherein the program module is configured to issue an instruction to the memory device to program user data to the memory device via the I/O buffer; and
   a program suspend module coupled to the I/O interface, wherein the program suspend module is configured to:
   issue at least one command to the memory device, the at least one command configured to suspend only a specified subset of one or more physical pages of a program operation executing within the memory device in response to receiving a memory read request from an application to perform a read operation on the memory device on which the program operation is being executed; and
   issue at least one command to the memory device, the at least one command configured to resume the program operation in response to completing the operation associated with the memory access request.

2. The apparatus of claim 1, wherein the apparatus further comprises a read module coupled to the I/O interface, wherein the read module is configured to receive user data satisfying the read request while the program operation is suspended.

3. The apparatus of claim 1, wherein the program suspend module is further configured to issue a command to the memory device to transfer user data corresponding to the program operation from the I/O buffer to a separate buffer coupled to the I/O buffer in response to receiving the at least one command configured to suspend the program operation.

4. The apparatus of claim 3, wherein the program suspend module is further configured to issue a command to the electronic memory device to transfer the user data corresponding to the program operation from the separate buffer to the I/O buffer in response to completing the operation associated with the memory access request.

5. The apparatus of claim 1, wherein the program suspend module is further configured to:
   issue a command to the apparatus to store a pulse count that describes a current programming voltage level corresponding to the program operation; and
   issue a command to the apparatus to resume the program operation at the stored pulse count in response to completing the operation associated with the memory access request.

6. The apparatus of claim 1, wherein the program suspend module is further configured to:
   issue a command to the apparatus to store a pulse count that describes a current programming voltage level corresponding to the program operation;
   calculate a threshold at which to suspend the program operation, wherein the threshold is based on the pulse count; and
   issue a command to the memory device controller to suspend the program operation in response to determining that the program operation satisfies the threshold.

7. The apparatus of claim 6, wherein the threshold is further based on a read/write sensitivity of an application requesting access to the memory device.

8. The apparatus of claim 1, wherein the memory access request comprises a program access request with a higher processing priority than the program operation executing within the memory device.

9. A memory device comprising:
   a memory array with a plurality of memory elements, wherein each memory element is configured to store data;
   an input/output (I/O) buffer coupled to the memory array; and
   a cache buffer coupled to the I/O buffer;
   a memory control manager coupled to the memory array, wherein the memory control manager is configured to:
   pause only a specified subset of one or more physical pages of a program operation to the memory array in response to receiving a pause command;
   transfer the data corresponding to the program operation from the cache buffer to the I/O buffer in response to receiving the resume command; and
   resume the program operation in response to receiving a resume command.

10. The device of claim 9, wherein the cache buffer is configured to receive and store data from the I/O buffer, wherein the memory control manager is configured to transfer data corresponding to the program operation from the I/O buffer to the cache buffer in response to receiving the pause command.

11. The device of claim 9, further comprising a read buffer coupled to the memory array, wherein the read buffer is configured to:
   receive data from the memory array corresponding to a read access request to the memory array while the program operation is paused; and
   send the data corresponding to the read access request to an I/O interface.

12. The device of claim 11, wherein the memory control manager is further configured to:
perform a plurality of operations while the program operation is paused, wherein the plurality of operations correspond to a plurality of memory access requests queued behind the program operation.

13. The device of claim 11, further comprising a first sense amplifier and a second sense amplifier coupled to the memory array, wherein the first sense amplifier is further coupled to the read buffer and the second sense amplifier is further coupled to the I/O buffer.

14. The device of claim 9, wherein the memory control manager is further configured to:
store a pulse count that describes a current programming voltage level corresponding to the program operation; and
resume the program operation at the stored pulse count in response to receiving a resume command.

15. The device of claim 9, wherein the memory control manager is further configured to:
store a pulse count that describes a current programming voltage level corresponding to the program operation;
calculate a threshold at which to pause the program operation, wherein the threshold is based on the pulse count; and
pause the program operation in response to determining that the program operation satisfies the threshold.

16. The device of claim 15, wherein the threshold is further based on a read/write sensitivity of an application requesting access to the memory array.

17. The device of claim 15, wherein the threshold is further based on a specified page type of the program operation.

18. A method comprising:
performing a portion of a program operation comprising receiving data from an input/output (I/O) buffer of a memory device and initiating writing the data to memory elements of a memory array, the I/O buffer residing on the same die as the memory elements;
receiving a memory access request at the memory device;
suspending the program operation in response to the program operation satisfying a suspend threshold based on a specified page type for the program operation;
transferring data corresponding to the program operation from the I/O buffer to a cache buffer coupled to the I/O buffer; and
performing an operation for the memory access request.

19. The method of claim 18, wherein the I/O buffer is coupled to the memory array and is configured to store buffered data accessible to the I/O interface.

20. The method of claim 18, wherein the memory access request comprises a read request, wherein the method further comprises:
reading data corresponding to the read request from the memory array to a read buffer coupled to the memory array while the program operation is suspended, wherein the read buffer is separate from the I/O buffer.

21. The method of claim 18, further comprising:
storing a pulse count that describes a current programming voltage level corresponding to the program operation; and
resuming the program operation at the stored pulse count in response to receiving a resume command.

22. The method of claim 18, further comprising:
storing a pulse count that describes a current programming voltage level corresponding to the program operation;
determining a threshold at which to suspend the program operation, wherein the threshold is based on the pulse count; and
suspending the program operation in response to determining that the program operation meets the threshold.

23. The method of claim 18, further comprising suspending only a specified page of the program operation.

24. A system comprising:
means for writing data to a memory device, wherein the memory device comprises an I/O buffer in communication with a memory array with a plurality of memory elements, wherein each memory element is configured to store data and the I/O buffer resides on the same die as the memory elements;
a cache buffer coupled to and located on the same die as the I/O buffer;
means for suspending only a specified subset of one or more pages of a program operation to the memory array in response to receiving a memory access request to the memory device; and
means for resuming the program operation in response to completing an operation associated with the memory access request.

* * * * *